(12) United States Patent
Liu et al.

(10) Patent No.: US 11,764,728 B1
(45) Date of Patent: Sep. 19, 2023

(54) OSCILLATOR USING CHOPPER CIRCUIT FOR SUPPRESSING FLICKER NOISE OF CURRENT SOURCES AND ASSOCIATED CLOCK GENERATION METHOD

(71) Applicant: Airoha Technology Corp., Hsinchu (TW)

(72) Inventors: Yu-Hua Liu, Hsinchu County (TW); Yao-Te Chiu, Hsinchu County (TW)

(73) Assignee: Airoha Technology Corp., Hsinchu (TW)

( * ) Notice: Subject to any disclaimer, the term of this patent is extended or adjusted under 35 U.S.C. 154(b) by 0 days.

(21) Appl. No.: 17/720,312

(22) Filed: Apr. 14, 2022

(51) Int. Cl.
    *H03K 3/0231* (2006.01)
    *H03B 5/24* (2006.01)
    *H03L 1/00* (2006.01)

(52) U.S. Cl.
    CPC .............. *H03B 5/24* (2013.01); *H03K 3/0231* (2013.01); *H03L 1/00* (2013.01)

(58) Field of Classification Search
    CPC ........... H03B 5/24; H03K 3/0231; H03L 1/00
    USPC ................................ 331/111, 143, 145, 153
    See application file for complete search history.

(56) References Cited

U.S. PATENT DOCUMENTS

| 7,915,929 | B2 | 3/2011 | Douskey | |
|---|---|---|---|---|
| 8,912,855 | B2 | 12/2014 | Hsiao | |
| 9,584,132 | B2 * | 2/2017 | Kim | ........................ H03L 1/02 |
| 10,498,308 | B2 * | 12/2019 | Ek | ........................ G01R 35/005 |
| 10,680,587 | B2 * | 6/2020 | Narwal | .................. H03K 4/502 |
| 10,931,234 | B2 * | 2/2021 | Matsuno | .................. H03B 5/24 |
| 11,349,488 | B2 * | 5/2022 | Chan | ........................ H03L 7/085 |
| 2012/0326796 | A1 * | 12/2012 | Giacomini | ............. H03K 3/354 |
| | | | | 331/108 R |
| 2013/0082720 | A1 * | 4/2013 | Tang | ........................ H03J 1/005 |
| | | | | 324/135 |
| 2013/0200956 | A1 * | 8/2013 | Hsiao | ...................... H03K 4/502 |
| | | | | 331/111 |
| 2016/0013753 | A1 * | 1/2016 | Tam | .................... H03K 3/0231 |
| | | | | 331/111 |

(Continued)

FOREIGN PATENT DOCUMENTS

| CN | 106464235 A | 2/2017 |
|---|---|---|
| CN | 111133681 A | 5/2020 |

(Continued)

*Primary Examiner* — Levi Gannon
(74) *Attorney, Agent, or Firm* — Winston Hsu

(57) ABSTRACT

An oscillator includes a first current source, a second current source, a first chopper circuit, a resistive component, a capacitive component, and a processing circuit. The first current source provides a first current. The second current source provides a second current. The first chopper circuit includes a first terminal coupled to the first current source, a second terminal coupled to the second current source, a third terminal coupled to the resistive component, and a fourth terminal coupled to the capacitive component. The processing circuit generates an output clock in response to a first voltage across the resistive component and a second voltage across the capacitive component. The first chopper circuit couples the first terminal and the second terminal to the third terminal and the fourth terminal, respectively and alternately. The resistive component and the capacitive component receive the first current and the second current, respectively and alternately.

12 Claims, 7 Drawing Sheets

(56) References Cited

U.S. PATENT DOCUMENTS

2017/0040944 A1* 2/2017 Satoh .................. H03K 4/502
2018/0145665 A1* 5/2018 Hurwitz ................ H03B 1/00

FOREIGN PATENT DOCUMENTS

CN         108288962 B     6/2021
CN         114094995 A     2/2022

* cited by examiner

OSCILLATOR USING CHOPPER CIRCUIT FOR SUPPRESSING FLICKER NOISE OF CURRENT SOURCES AND ASSOCIATED CLOCK GENERATION METHOD

BACKGROUND OF THE INVENTION

1. Field of the Invention

The present invention relates to clock generation, and more particularly, to an oscillator using a chopper circuit for suppressing flicker noise of current sources and an associated clock generation method.

2. Description of the Prior Art

On-chip oscillators are in high demand by low-cost and single-chip systems. For example, relaxation oscillators are usually employed for low-power operation. Relaxation oscillators are preferred against crystal oscillators because the former do not require any external components and can be cheaply implemented in a CMOS (Complementary Metal Oxide Semiconductor) technology. However, the relaxation oscillators are susceptible to device mismatch, flicker noise, etc. Thus, there is a need for an innovative low-power high-accuracy oscillator design.

SUMMARY OF THE INVENTION

One of the objectives of the claimed invention is to provide an oscillator using a chopper circuit for suppressing flicker noise of current sources and an associated clock generation method.

According to a first aspect of the present invention, an oscillator is disclosed. The oscillator includes a first current source, a second current source, a first chopper circuit, a resistive component, a capacitive component, and a processing circuit. The first current source is arranged to provide a first current. The second current source is arranged to provide a second current. The first chopper circuit includes a first terminal coupled to the first current source and arranged to receive the first current, a second terminal coupled to the second current source and arranged to receive the second current, a third terminal coupled to the resistive component, and a fourth terminal coupled to the capacitive component. The processing circuit is arranged to generate an output clock in response to a first voltage across the resistive component and a second voltage across the capacitive component. The first chopper circuit is arranged to couple the first terminal and the second terminal to the third terminal and the fourth terminal, respectively and alternately. The resistive component and the capacitive component are arranged to receive the first current and the second current, respectively and alternately.

According to a second aspect of the present invention, an exemplary clock generation method is disclosed. The exemplary clock generation method includes: providing a first current through a first current source, providing a second current through a second current source, coupling a first terminal of a first chopper circuit to the first current source for receiving the first current, coupling a second terminal of the first chopper circuit to the second current source for receiving the second current, coupling a third terminal of the first chopper circuit to a resistive component, coupling a fourth terminal of the first chopper circuit to a capacitive component, generating an output clock in response to a first voltage across the resistive component and a second voltage across the capacitive component, and controlling the first chopper circuit to couple the first terminal and the second terminal to the third terminal and the fourth terminal, respectively and alternately, wherein the resistive component and the capacitive component receive the first current and the second current, respectively and alternately.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . .". Also, the term "couple" is intended to mean either an indirect or direct electrical connection. Accordingly, if one device is coupled to another device, that connection may be through a direct electrical connection, or through an indirect electrical connection via other devices and connections.

Figure 1:
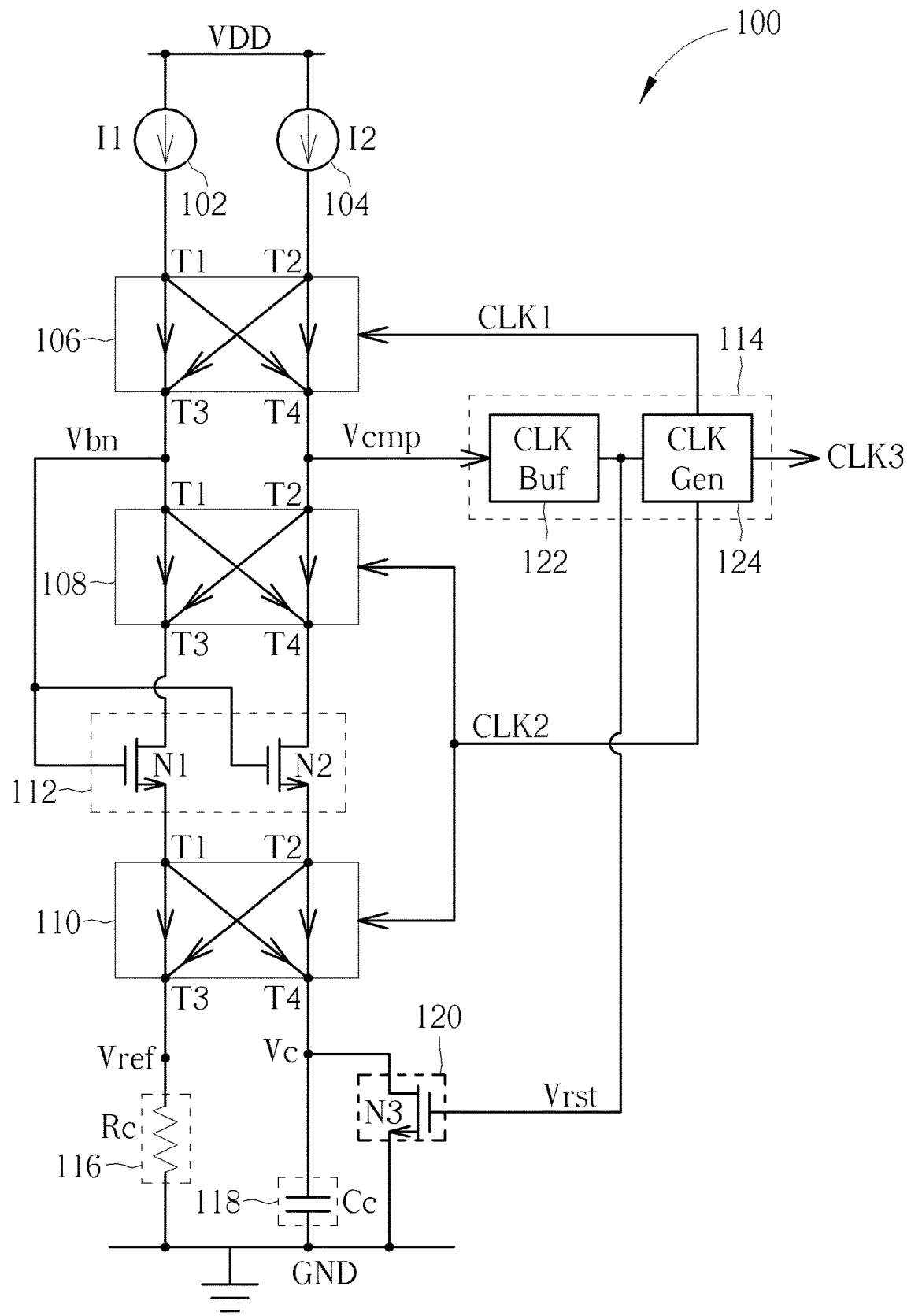
FIG. 1 is a diagram illustrating an oscillator with a current-mode comparator according to an embodiment of the present invention.

FIG. 1 is a diagram illustrating an oscillator with a current-mode comparator according to an embodiment of the present invention. The oscillator 100 may employ low-power oscillator topology. For example, the oscillator 100 is a relaxation oscillator with a current-mode comparator. As shown in FIG. 1, the oscillator 100 includes a plurality of current sources 102, 104, a plurality of chopper circuits 106, 108, 110, a current-mode comparator 112, a processing circuit 114, a resistive component 116, a capacitive component 118, and a reset switch 120. The processing circuit 114 may include a clock buffer (labeled by "CLK Buf") 122 and a clock generator circuit (labeled by "CLK Gen") 124. It should be noted that only the components pertinent to the present invention are illustrated in FIG. 1. In practice, the oscillator 100 may include additional components, depending upon actual design considerations.

The current source 102 is coupled to a supply voltage VDD, and is arranged to provide a current I1. The current source 104 is coupled to the supply voltage VDD, and is arranged to provide a current I2. For example, the current sources 102 and 104 are parts of a current mirror circuit, and the current I1 and the current I2 have the same current value $I_{ref}$ (i.e. $I1=I2=I_{ref}$). The current consumption of a system can be reduced by decreasing the number of current-conducting branches. Thus, the comparator needed by the oscillator 100 may be implemented in the current mode. As shown in FIG. 1, the current-mode comparator 112 includes two N-type metal-oxide-semiconductor (NMOS) transistors N1 and N2 that are biased by the same gate voltage $V_{bn}$. The current passing through one of the NMOS transistors N1 and N2 included in the current-mode comparator 112 also acts as a charging current of the capacitive component 118 with a capacitance value $C_c$. The current passing through another of the NMOS transistors N1 and N2 included in the current-mode comparator 112 is also used for establishing a reference voltage $V_{ref}$ across the resistive component 116 with a resistance value $R_c$. Such a current-sharing scheme reduces the number of current-conducting braches, and leads to a lower current consumption.

Figure 2:
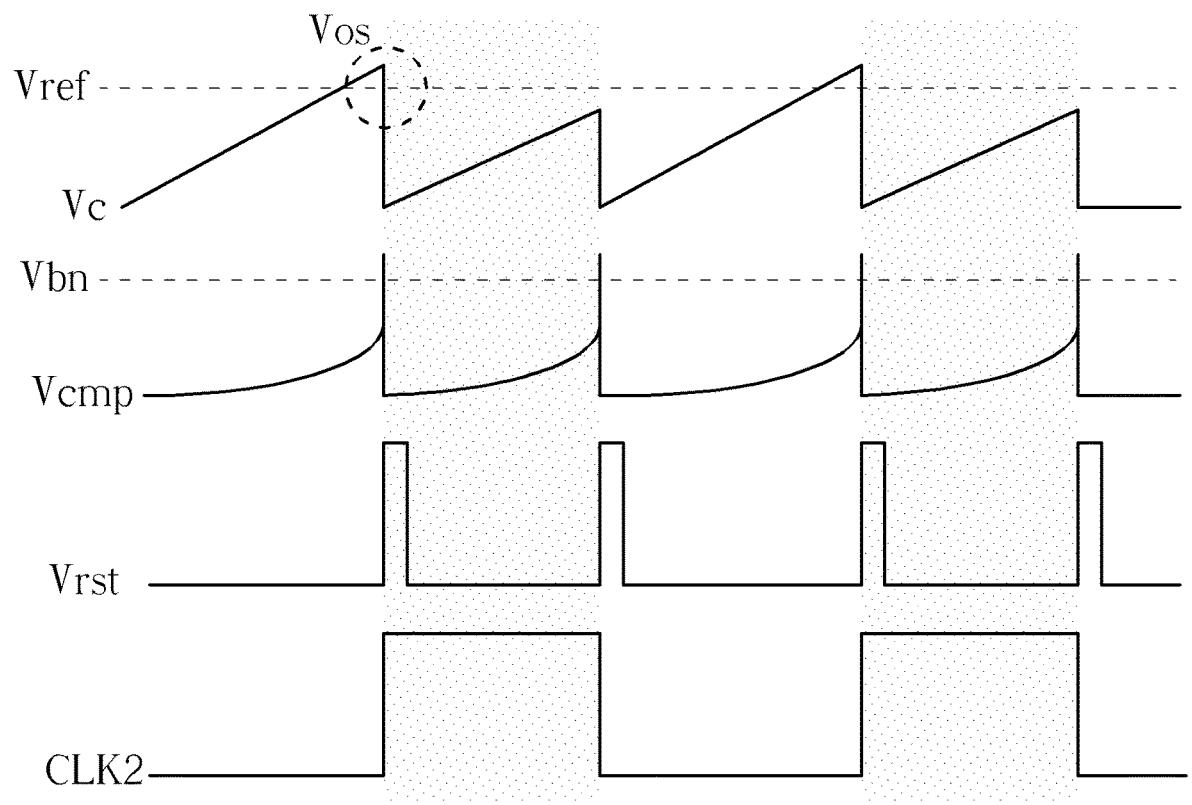
FIG. 2 is a timing diagram of the oscillator shown in FIG. 1.

The reset switch 120 may be implemented by an NMOS transistor N3 having a gate terminal coupled to the clock buffer 122, a drain terminal coupled to one end of the capacitive component 118, and a source terminal used to receive a ground voltage GND (which is coupled to another end of the capacitive component 118). Please refer to FIG. 1 in conjunction with FIG. 2. FIG. 2 is a timing diagram of the oscillator 100 shown in FIG. 1. Initially, the reset switch 120 is turned on for resetting the voltage $V_c$ to the ground voltage GND, thus causing the voltage $V_{cmp}$ to be pulled low. Once the voltage $V_c$ exceeds the reference voltage $V_{ref}$ due to charging of the capacitive component 118, the NMOS transistor N2 amplifies the voltage difference ($V_c-V_{ref}$) and the voltage $V_{cmp}$ rises, thus triggering the clock buffer 122 to generate one reset pulse Vrst which in turn resets the voltage $V_c$ to the ground voltage GND. One reset pulse Vrst is generated periodically, and the occurrence frequency of the reset pulse Vrst depends on the resistance value Rc and the capacitance value Cc. The periodic signal (i.e. reset pulse signal) output from the clock buffer 122 is fed into the clock generator circuit 124. For example, the clock generator circuit 124 may include a plurality of frequency dividers (e.g., flip-flops acting as divide-by-2 dividers) for generating an output clock CLK3 with a lower clock frequency (e.g. 32 kHz) according to the periodic signal with a higher frequency (e.g. 128 kHz).

The typical relaxation oscillator is susceptible to device mismatch, flicker noise, etc. To address the flicker noise issue, the present invention proposes adding one chopper circuit 106 to the oscillator 100. To address the device mismatch issue, the present invention proposes adding two chopper circuits 108 and 110 to the oscillator 100. Specifically, the chopper circuit 106 is used to mitigate the frequency drift resulting from flicker noise of the current sources 102 and 104, and the chopper circuits 108 and 110 are jointly used to mitigate the frequency drift resulting from an offset $V_{os}$ between NMOS transistors N1 and N2 of the current-mode comparator 112.

Regarding the chopper circuit 106, it has four terminals T1, T2, T3, and T4, where the terminal T1 is coupled to the current source 102 for receiving the current I1, and the terminal T2 is coupled to the current source 104 for receiving the current I2. The chopper circuit 106 is arranged to couple its terminals T1 and T2 to its terminals T3 and T4, respectively and alternately. The chopper circuit 106 operates according to a chopper clock CLK1 with a clock frequency F1. For example, during one half clock cycle of the chopper clock CLK1, the terminal T1 of the chopper circuit 106 is coupled to the terminal T3 of the chopper circuit 106 and the terminal T2 of the chopper circuit 106 is coupled to the terminal T4 of the chopper circuit 106; and during the next half clock cycle of the chopper clock CLK1, the terminal T1 of the chopper circuit 106 is coupled to the terminal T4 of the chopper circuit 106 and the terminal T2 of the chopper circuit 106 is coupled to the terminal T3 of the chopper circuit 106.

Regarding the chopper circuit 108, it has four terminals T1, T2, T3, and T4, where the terminal T1 is coupled to the terminal T3 of the chopper circuit 106, the terminal T2 is coupled to the terminal T4 of the chopper circuit 106, the terminal T3 is coupled to a drain terminal of the NMOS transistor N1, and the terminal T4 is coupled to a drain terminal of the NMOS transistor N2. The chopper circuit 108 is arranged to couple its terminals T1 and T2 to its terminals T3 and T4, respectively and alternately. The chopper circuit 108 operates according to a chopper clock CLK2 with a clock frequency F2. For example, during one half clock cycle of the chopper clock CLK2, the terminal T1 of the chopper circuit 108 is coupled to the terminal T3 of the chopper circuit 108 and the terminal T2 of the chopper circuit 108 is coupled to the terminal T4 of the chopper circuit 108; and during the next half clock cycle of the chopper clock CLK2, the terminal T1 of the chopper circuit 108 is coupled to the terminal T4 of the chopper circuit 108 and the terminal T2 of the chopper circuit 108 is coupled to the terminal T3 of the chopper circuit 108.

Regarding the chopper circuit 110, it has four terminals T1, T2, T3, and T4, where the terminal T1 is coupled to a source terminal of the NMOS transistor N1, the terminal T2 is coupled to a source terminal of the NMOS transistor N2, the terminal T3 is coupled to one end of the resistive component 116, and the terminal T4 is coupled to one end of the capacitive component 118. The chopper circuit 108 is arranged to couple its terminals T1 and T2 to its terminals T3 and T4, respectively and alternately. Like the chopper circuit 108, the chopper circuit 110 operates according to the chopper clock CLK2 with the clock frequency F2. For example, during one half clock cycle of the chopper clock CLK2, the terminal T1 of the chopper circuit 110 is coupled to the terminal T3 of the chopper circuit 110 and the terminal T2 of the chopper circuit 110 is coupled to the terminal T4 of the chopper circuit 110; and during the next half clock cycle of the chopper clock CLK2, the terminal T1 of the chopper circuit 110 is coupled to the terminal T4 of the chopper circuit 110 and the terminal T2 of the chopper circuit 110 is coupled to the terminal T3 of the chopper circuit 110.

To ensure a desired chopping operation for flicker noise of current sources 102, 104 and a desired chopping operation for an offset resulting from device mismatch of current-mode comparator 112, the chopper clocks CLK1 and CLK2 are required to have different clock frequencies (i.e. F2≠F1). For example, one of the clock frequencies F1 and F2 may be an integer multiple of another the clock frequencies F1 and F2.

Figure 3:
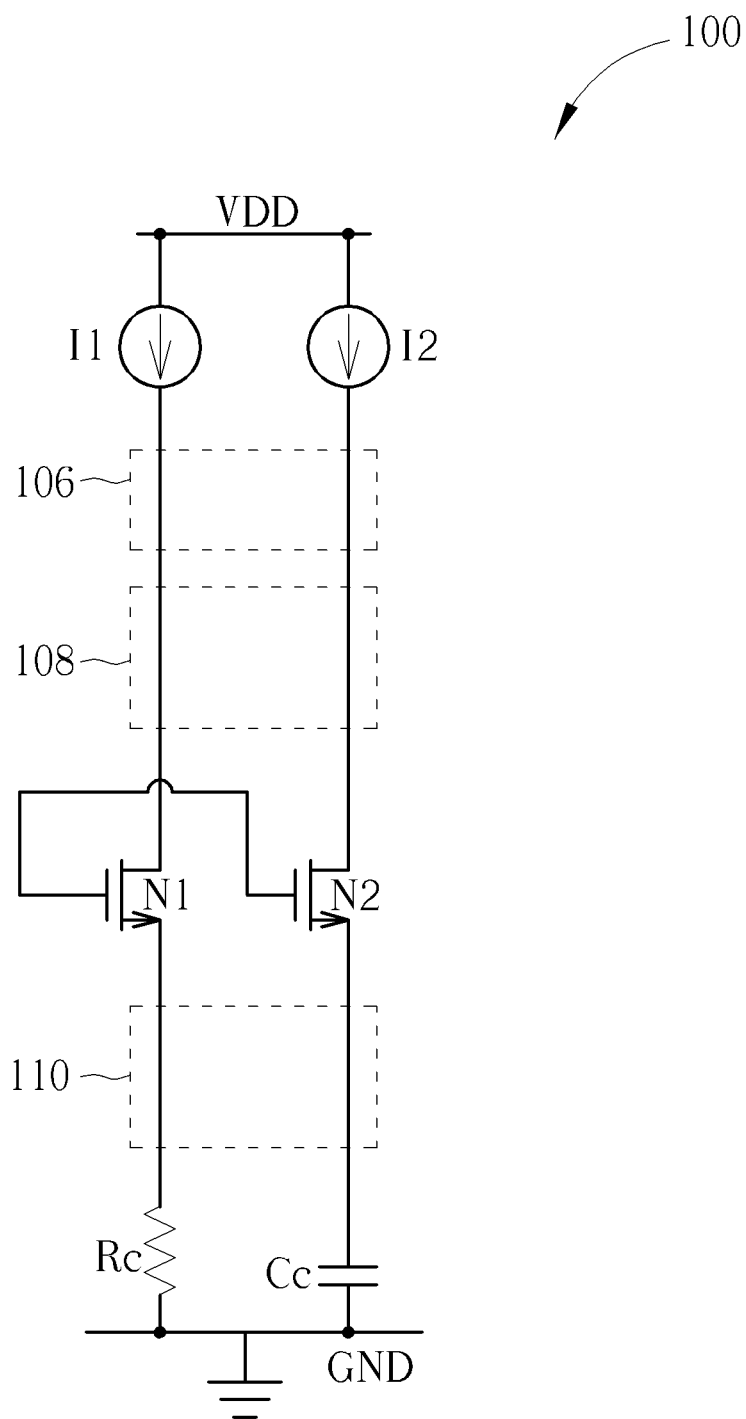
FIG. 3 is a diagram illustrating a first configuration of chopper circuits shown in FIG. 1 according to an embodiment of the present invention.

Please refer to FIG. 1 in conjunction with FIG. 3. FIG. 3 is a diagram illustrating a first configuration of the chopper circuits 106, 108, and 110 according to an embodiment of the present invention. The chopper circuit 106 is controlled by the chopper clock CLK1 to have its terminal T1 coupled to its terminal T3 and its terminal T2 coupled to its terminal T4. The chopper circuit 108 is controlled by the chopper clock CLK2 to have its terminal T1 coupled to its terminal T3 and its terminal T2 coupled to its terminal T4. The chopper circuit 110 is controlled by the chopper clock CLK2 to have its terminal T1 coupled to its terminal T3 and its terminal T2 coupled to its terminal T4.

Figure 4:
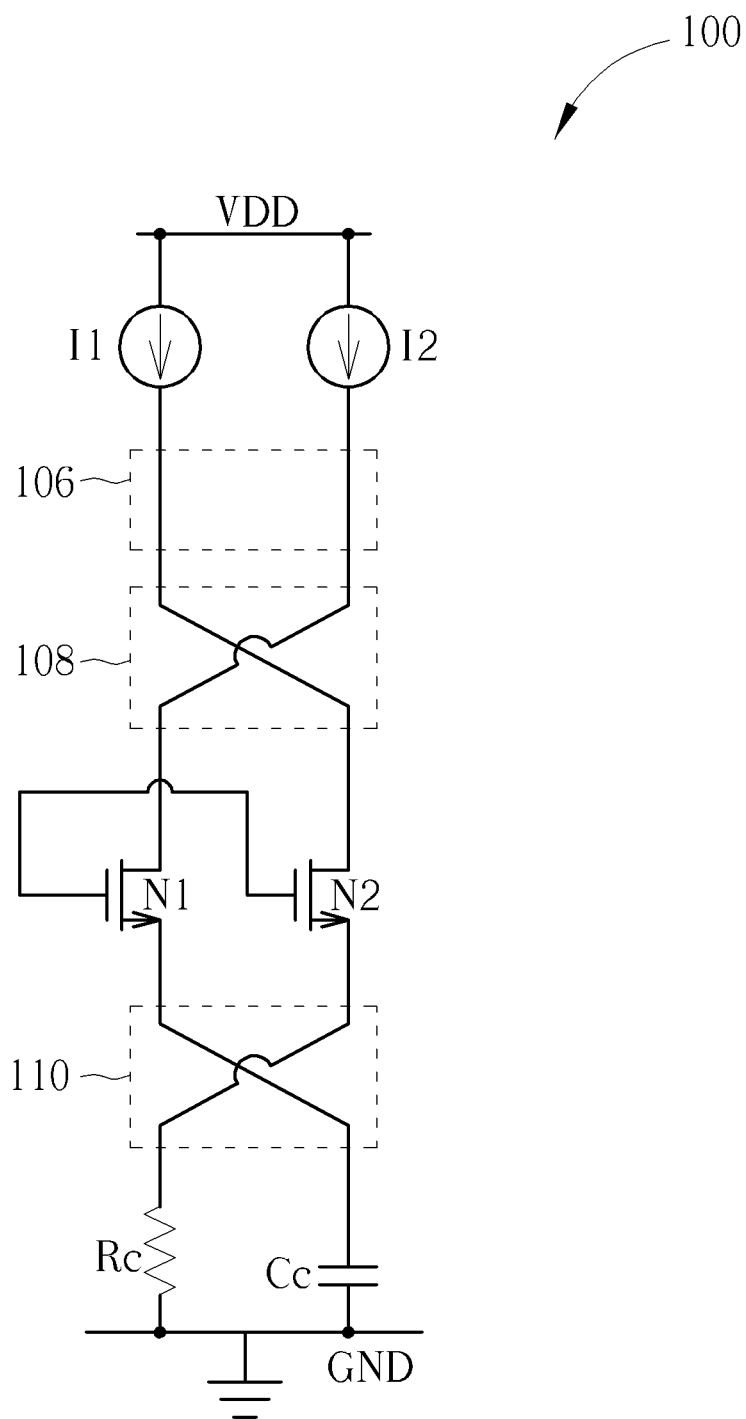
FIG. 4 is a diagram illustrating a second configuration of chopper circuits shown in FIG. 1 according to an embodiment of the present invention.

Please refer to FIG. 1 in conjunction with FIG. 4. FIG. 4 is a diagram illustrating a second configuration of the chopper circuits 106, 108, and 110 according to an embodiment of the present invention. The chopper circuit 106 is controlled by the chopper clock CLK1 to have its terminal T1 coupled to its terminal T3 and its terminal T2 coupled to its terminal T4. The chopper circuit 108 is controlled by the chopper clock CLK2 to have its terminal T1 coupled to its terminal T4 and its terminal T2 coupled to its terminal T3. The chopper circuit 110 is controlled by the chopper clock CLK2 to have its terminal T1 coupled to its terminal T4 and its terminal T2 coupled to its terminal T3.

Figure 5:
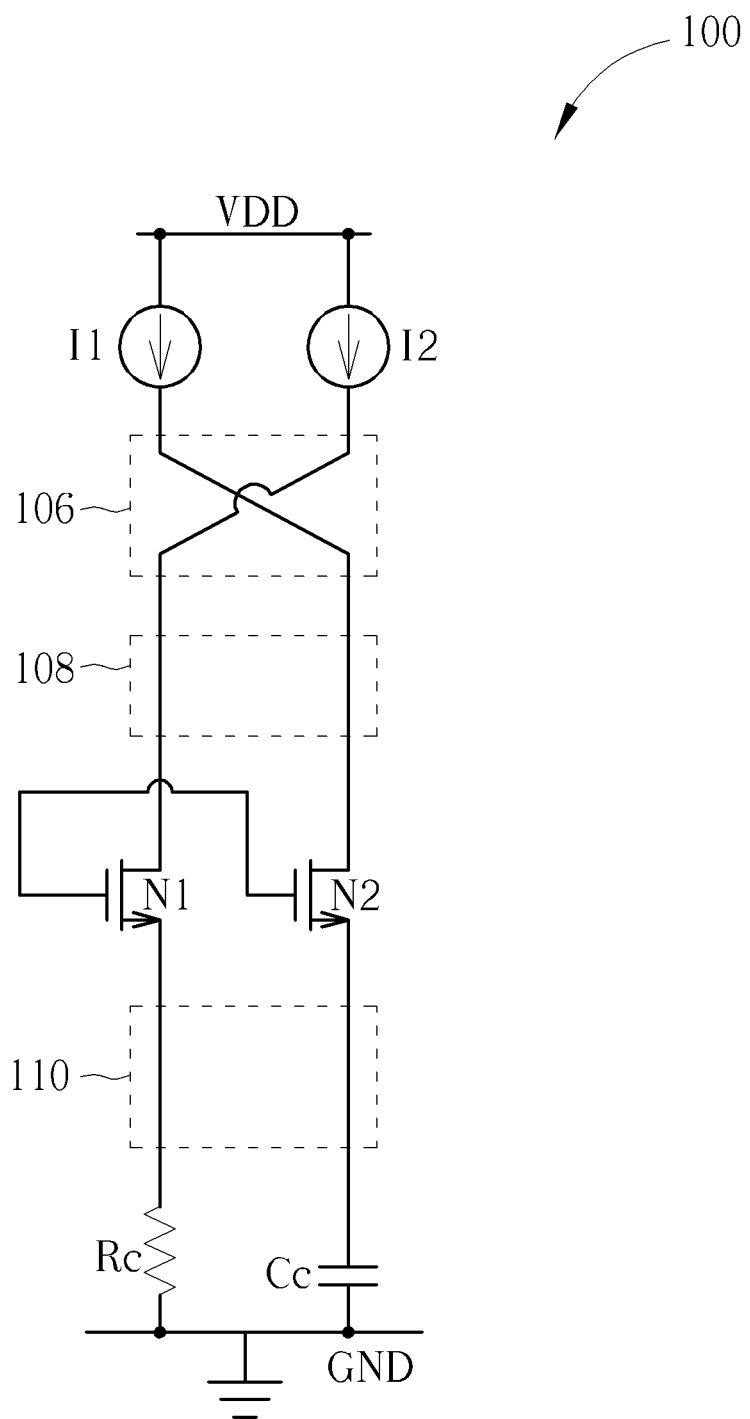
FIG. 5 is a diagram illustrating a third configuration of chopper circuits shown in FIG. 1 according to an embodiment of the present invention.

Please refer to FIG. 1 in conjunction with FIG. 5. FIG. 5 is a diagram illustrating a third configuration of the chopper circuits 106, 108, and 110 according to an embodiment of the present invention. The chopper circuit 106 is controlled by the chopper clock CLK1 to have its terminal T1 coupled to its terminal T4 and its terminal T2 coupled to its terminal T3. The chopper circuit 108 is controlled by the chopper clock CLK2 to have its terminal T1 coupled to its terminal T3 and its terminal T2 coupled to its terminal T4. The chopper circuit 110 is controlled by the chopper clock CLK2 to have its terminal T1 coupled to its terminal T3 and its terminal T2 coupled to its terminal T4.

Figure 6:
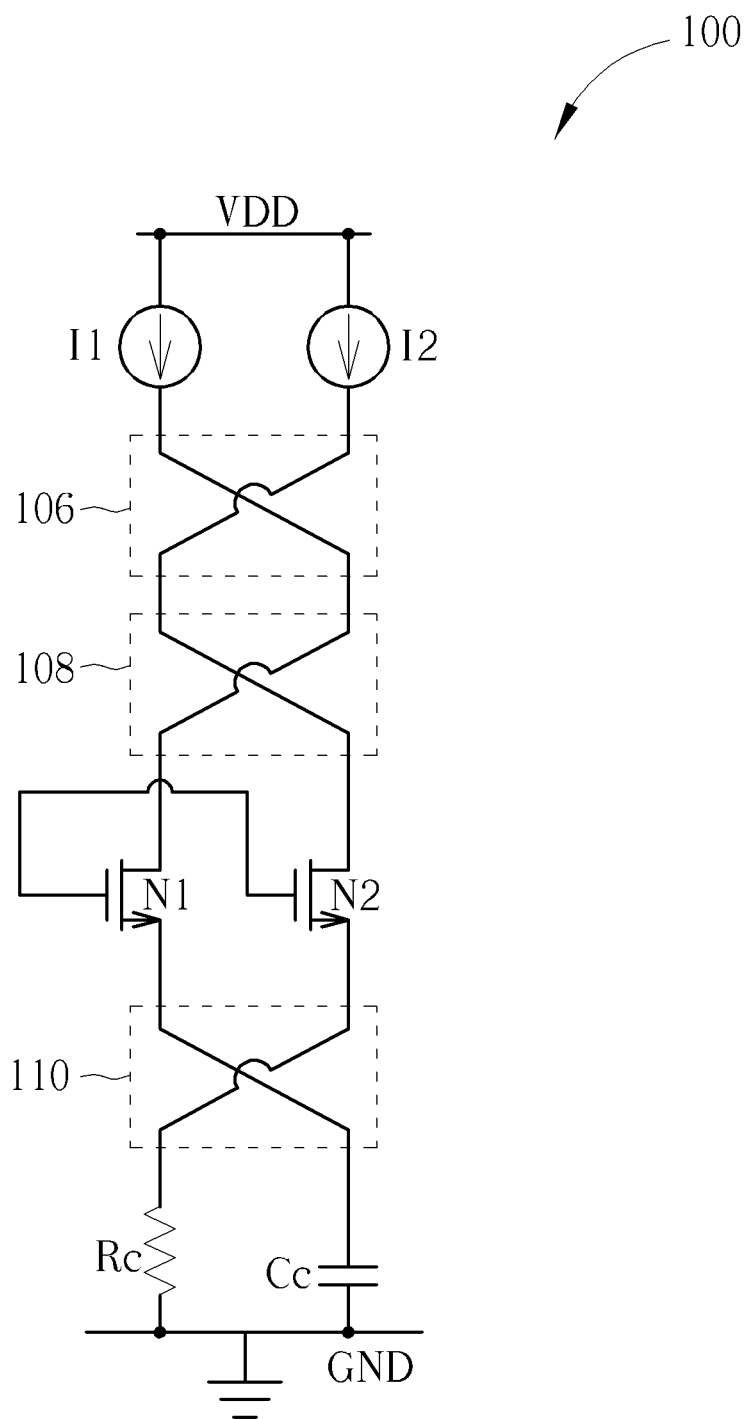
FIG. 6 is a diagram illustrating a fourth configuration of chopper circuits shown in FIG. 1 according to an embodiment of the present invention.

Please refer to FIG. 1 in conjunction with FIG. 6. FIG. 6 is a diagram illustrating a fourth configuration of the chopper circuits 106, 108, and 110 according to an embodiment of the present invention. The chopper circuit 106 is controlled by the chopper clock CLK1 to have its terminal T1 coupled to its terminal T4 and its terminal T2 coupled to its terminal T3. The chopper circuit 108 is controlled by the chopper clock CLK2 to have its terminal T1 coupled to its terminal T4 and its terminal T2 coupled to its terminal T3. The chopper circuit 110 is controlled by the chopper clock CLK2 to have its terminal T1 coupled to its terminal T4 and its terminal T2 coupled to its terminal T3.

As mentioned above, the chopper clocks CLK1 and CLK2 are required to have different clock frequencies (i.e. F2≠F1) for achieving the desired chopping operation for flicker noise of current sources 102 and 104 and the desired chopping operation for an offset resulting from device mismatch of current-mode comparator 112. If the chopper clocks CLK1 and CLK2 are set to have the same clock frequency, one of the desired chopping operation for flicker noise of current sources 102 and 104 and the desired chopping operation for an offset resulting from device mismatch of current-mode comparator 112 may fail due to the fact that there are only two configurations (e.g. first configuration shown in FIG. 3 and fourth configuration shown in FIG. 6) available under the condition of F1=F2.

Furthermore, the chopper circuit 106 is indispensable for chopping the flicker noise, and the chopper circuit 108 is indispensable for chopping the offset resulting from device mismatch. That is, the chopper circuits 106 and 108 cannot be merged into a single chopper circuit. If one of the chopper circuits 106 and 108 is omitted, the current-mode comparator function may fail. For example, the voltage $V_{cmp}$ may be set by $V_{ref}+V_{gs}$ rather than $V_c+V_{ds}$, where $V_{gs}$ is the gate-source voltage of the NMOS transistor N1, and $V_{ds}$ is the drain-source voltage of the NMOS transistor N2.

As mentioned above, the clock generator circuit 124 may include a plurality of frequency dividers (e.g., flip-flops acting as divide-by-2 dividers) for generating the output clock CLK3 with a lower clock frequency (e.g. 32 kHz) according to the periodic signal with a higher frequency (e.g. 128 kHz). In this embodiment, the chopper clocks CLK1 and CLK2 may be by-products of the frequency division process for generating the output clock CLK3, such that the hardware cost of additional clock generators for generating the chopper clocks CLK1 and CLK2 can be saved. For example, a frequency-divided clock with a clock frequency of 64 kHz may be output from one frequency divider of the clock generator circuit 124 to serve as one of the chopper clocks CLK1 and CLK2, and a frequency-divided clock with a clock frequency of 32 kHz may be output from another frequency divider of the clock generator circuit 124 to serve as another of the chopper clocks CLK1 and CLK2.

Regarding the oscillator 100 shown in FIG. 1, the required comparator is implemented in the current mode. However, this is for illustrative purposes only, and is not meant to be a limitation of the present invention. Alternatively, the same concept of using a chopper circuit for suppressing flicker noise of current sources may be applied to an oscillator with a voltage-mode comparator.

Figure 7:
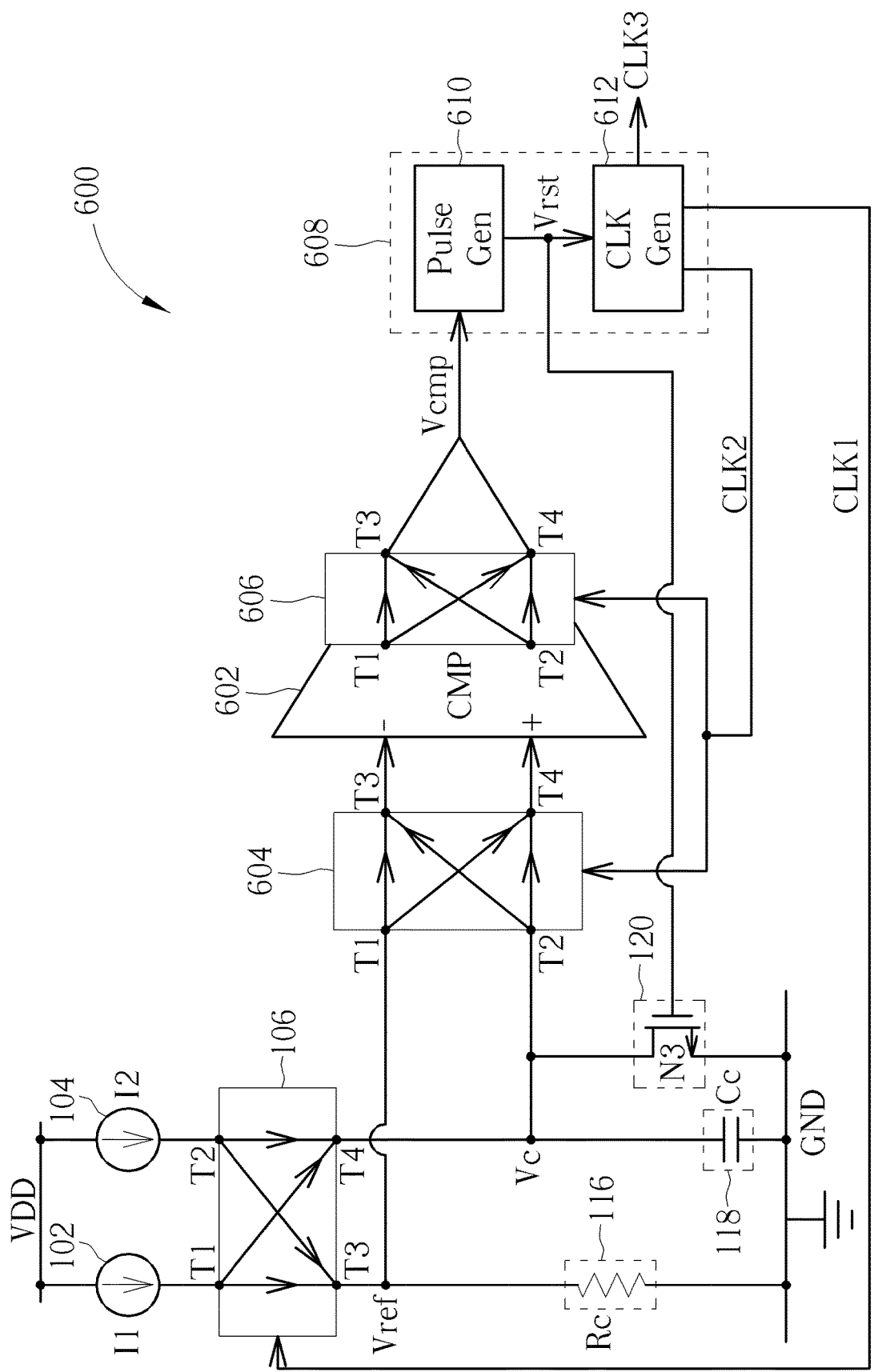
FIG. 7 is a diagram illustrating an oscillator with a voltage-mode comparator according to an embodiment of the present invention.

FIG. 7 is a diagram illustrating an oscillator with a voltage-mode comparator according to an embodiment of the present invention. In this embodiment, the oscillator 600 is a relaxation oscillator. The major difference between the oscillators 600 and 100 is that the oscillator 600 includes a voltage-mode comparator (labeled by "CMP") 602, a plurality of chopper circuits 604, 606, and a processing circuit 608, where the processing circuit 608 may include a pulse generator circuit (labeled by "Pulse Gen") 610 and a clock generator circuit (labeled by "CLK Gen") 612.

The chopper circuits 604 and 606 operate according to the chopper clock CLK2 with the clock frequency F2, where the clock frequency F2 is different from the clock frequency F1 of the chopper clock CLK1 used by the chopper circuit 106. For example, a frequency-divided clock with a clock frequency of 64 kHz may be output from one frequency divider of the clock generator circuit 612 to serve as one of the chopper clocks CLK1 and CLK2, and a frequency-divided clock with a clock frequency of 32 kHz may be output from another frequency divider of the clock generator circuit 612 to serve as another of the chopper clocks CLK1 and CLK2.

The chopper circuit 604 is arranged to couple its terminals T1 and T2 to its terminals T3 and T4, respectively and alternately. For example, during one half clock cycle of the chopper clock CLK2, the terminal T1 of the chopper circuit 604 is coupled to the terminal T3 of the chopper circuit 604 and the terminal T2 of the chopper circuit 604 is coupled to the terminal T4 of the chopper circuit 604; and during the next half clock cycle of the chopper clock CLK2, the terminal T1 of the chopper circuit 604 is coupled to the terminal T4 of the chopper circuit 604 and the terminal T2 of the chopper circuit 604 is coupled to the terminal T3 of the chopper circuit 604.

The chopper circuit 606 is arranged to couple its terminals T1 and T2 to its terminals T3 and T4, respectively and alternately. For example, during one half clock cycle of the chopper clock CLK2, the terminal T1 of the chopper circuit 606 is coupled to the terminal T3 of the chopper circuit 606 and the terminal T2 of the chopper circuit 606 is coupled to the terminal T4 of the chopper circuit 606; and during the next half clock cycle of the chopper clock CLK2, the terminal T1 of the chopper circuit 606 is coupled to the terminal T4 of the chopper circuit 606 and the terminal T2 of the chopper circuit 606 is coupled to the terminal T3 of the chopper circuit 606.

The chopper circuit 604 is coupled between the chopper circuit 106 and the voltage-mode comparator 602. Specifically, the terminal T3 of the chopper circuit 106 is coupled to one end of the resistive component 116, and the terminal T1 of the chopper circuit 604 is also coupled to one end of the resistive component 116 for receiving the reference voltage $V_{ref}$ across the resistive component 116; in addition, the terminal T4 of the chopper circuit 106 is coupled to one end of the capacitive component 118, and the terminal T2 of the chopper circuit 604 is also coupled to one end of the capacitive component 118 for receiving the voltage $V_c$ across the capacitive component 118. The chopper circuit 606 is coupled between the voltage-mode comparator 602 and the processing circuit 608 (particularly, pulse generator circuit 610 of processing circuit 608). The voltage $V_{cmp}$ is set by comparing the voltage $V_c$ with the reference voltage $V_{ref}$. For example, when the chopper circuit 604 transmits the reference voltage $V_{ref}$ to an inverting input node (−) of the voltage-mode comparator 602 and transmits the voltage $V_c$ to a non-inverting input node (+) of the voltage-mode comparator 602, the chopper circuit 606 may output a voltage at a non-inverting output node of the voltage-mode comparator 602 as the voltage $V_{cmp}$. For another example, when the chopper circuit 604 transmits the reference voltage $V_{ref}$ to a non-inverting input node (+) of the voltage-mode comparator 602 and transmits the voltage $V_c$ to an inverting input node (−) of the voltage-mode comparator 602, the chopper circuit 606 may output a voltage at an inverting output node of the voltage-mode comparator 602 as the voltage $V_{cmp}$. However, this is for illustrative purposes only, and is not meant to be a limitation of the present invention.

Once the voltage $V_c$ exceeds the reference voltage $V_{ref}$ due to charging of the capacitive component 118, the voltage-mode comparator 602 sets the voltage $V_{cmp}$ by a logic high level, thus triggering the pulse generator circuit 610 to generate one reset pulse Vrst which in turn resets the voltage $V_c$ to the ground voltage GND. One reset pulse Vrst is generated periodically, and the occurrence frequency of the reset pulse Vrst depends on the capacitance value $R_c$ and the capacitance value $C_c$. The periodic signal (i.e. reset pulse signal) output from the pulse generator circuit 610 is fed into the clock generator circuit 612. For example, the clock generator circuit 612 may include a plurality of frequency dividers (e.g., flip-flops acting as divide-by-2 dividers) for generating the output clock CLK3 with a lower clock frequency (e.g. 32 kHz) according to the periodic signal with a higher frequency (e.g. 128 kHz).

To ensure a desired chopping operation for flicker noise of current sources 102 and 104 and a desired chopping operation for an offset resulting from device mismatch of voltage-mode comparator 602, the chopper clocks CLK1 and CLK2 are required to have different clock frequencies (i.e. F2≠F1). For example, one of the clock frequencies F1 and F2 may be an integer multiple of another the clock frequencies F1 and F2. Furthermore, the chopper circuit 106 is indispensable for chopping the flicker noise, and the chopper circuit 604 is indispensable for chopping the offset resulting from device mismatch. That is, the chopper circuits 106 and 604 cannot be merged into a single chopper circuit. In some embodiments of the present invention, the chopper clocks CLK1 and CLK2 may be by-products of the frequency division process for generating the output clock CLK3, such that the hardware cost of additional clock generators for generating the chopper clocks CLK1 and CLK2 can be saved.

Since a person skilled in the art can readily understand principles of the chopper circuits 106, 602, and 604 shown in FIG. 7 after reading above paragraphs directed to the chopper circuits 106, 108, and 110 shown in FIG. 1, further description is omitted here for brevity.

Regarding the oscillator 100 shown in FIG. 1, the chopper circuit 106 is employed for reducing the frequency drift caused by flicker noise of the current sources 102 and 104 and the chopper circuits 108 and 110 are employed for reducing the frequency drift caused by device mismatch of the current-mode comparator 112. Regarding the oscillator 600 shown in FIG. 7, the chopper circuit 106 is employed for reducing the frequency drift caused by flicker noise of the current sources 102 and 104 and the chopper circuits 604 and 606 are employed for reducing the frequency drift caused by device mismatch of the voltage-mode comparator 602. However, these are for illustrative purposes only, and are not meant to be limitations of the present invention. In practice, any oscillator circuit using a chopper circuit for suppressing flicker noise of current sources falls within the scope of the present invention. That is, the oscillator 100 may be modified to omit the chopper circuits 108 and 110, and the oscillator 600 may be modified to omit the chopper circuits 604 and 606.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillator comprising:
    a first current source, arranged to provide a first current;
    a second current source, arranged to provide a second current;
    a first chopper circuit, comprising:
        a first terminal, coupled to the first current source and arranged to receive the first current;
        a second terminal, coupled to the second current source and arranged to receive the second current;
        a third terminal; and
        a fourth terminal;
    a resistive component, coupled to the third terminal;
    a capacitive component, coupled to the fourth terminal;
    a processing circuit, arranged to generate an output clock in response to a first voltage across the resistive component and a second voltage across the capacitive component;
    a voltage-mode comparator; and
    a second chopper circuit, coupled between the voltage-mode comparator and the processing circuit;
    wherein the first chopper circuit is arranged to couple the first terminal and the second terminal to the third terminal and the fourth terminal, respectively and alternately; and the resistive component and the capacitive component are arranged to receive the first current and the second current, respectively and alternately.

2. The oscillator of claim 1, wherein the first chopper circuit is arranged to reduce frequency drift caused by flicker noise of the first current source and the second current source.

3. The oscillator of claim 1, further comprising:
    a third chopper circuit, coupled between the first chopper circuit and the voltage-mode comparator.

4. The oscillator of claim 3, wherein the first chopper circuit operates according to a first chopper clock with a first clock frequency, and both of the second chopper circuit and the third chopper circuit operate according to a second chopper clock with a second clock frequency, and the second clock frequency is different from the first clock frequency.

5. The oscillator of claim 4, wherein one of the first clock frequency and the second clock frequency is an integer multiple of another of the first clock frequency and the second clock frequency.

6. The oscillator of claim 3, wherein the first chopper circuit operates according to a first chopper clock, both of the second chopper circuit and the third chopper circuit operate according to a second chopper clock, and the processing circuit comprises:

a clock generator circuit, arranged to generate the output clock, the first chopper clock, and the second chopper clock through frequency division of a periodic signal, wherein a frequency of the periodic signal depends on a resistance value of the resistive component and a capacitance value of the capacitive component.

7. A clock generation method comprising:
providing a first current through a first current source;
providing a second current through a second current source;
coupling a first terminal of a first chopper circuit to the first current source for receiving the first current;
coupling a second terminal of the first chopper circuit to the second current source for receiving the second current;
coupling a third terminal of the first chopper circuit to a resistive component;
coupling a fourth terminal of the first chopper circuit to a capacitive component;
generating an output clock in response to a first voltage across the resistive component and a second voltage across the capacitive component;
coupling a second chopper circuit between a voltage-mode comparator and a processing circuit, wherein the output clock is generated through the processing circuit; and
controlling the first chopper circuit to couple the first terminal and the second terminal to the third terminal and the fourth terminal, respectively and alternately, wherein the resistive component and the capacitive component receive the first current and the second current, respectively and alternately.

8. The clock generation method of claim 7, wherein frequency drift caused by flicker noise of the first current source and the second current source is reduced by controlling the first chopper circuit to couple the first terminal and the second terminal to the third terminal and the fourth terminal, respectively and alternately.

9. The clock generation method of claim 7, further comprising:

coupling a third chopper circuit between the first chopper circuit and the voltage-mode comparator.

10. The clock generation method of claim 9, wherein the first chopper circuit operates according to a first chopper clock with a first clock frequency, and both of the second chopper circuit and the third chopper circuit operate according to a second chopper clock with a second clock frequency, and the second clock frequency is different from the first clock frequency.

11. The clock generation method of claim 10, wherein one of the first clock frequency and the second clock frequency is an integer multiple of another of the first clock frequency and the second clock frequency.

12. The clock generation method of claim 9, wherein the first chopper circuit operates according to a first chopper clock, both of the second chopper circuit and the third chopper circuit operate according to a second chopper clock, and generating the output clock in response to the first voltage across the resistive component and the second voltage across the capacitive component comprises:

generating the output clock, the first chopper clock, and the second chopper clock through frequency division of a periodic signal, wherein a frequency of the periodic signal depends on a resistance value of the resistive component and a capacitance value of the capacitive component.

* * * * *